United States Patent
Huang et al.

(10) Patent No.: US 6,326,574 B1
(45) Date of Patent: Dec. 4, 2001

(54) SLEEVE FOR AN ADAPTER FLANGE OF THE GASONICS L3510 ETCHER

(75) Inventors: Chi-Shu Huang, Chungli; Chia-Lin Yeh, Tainan, both of (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/400,195

(22) Filed: Sep. 21, 1999

(51) Int. Cl.$^7$ ....................................... H05B 3/04
(52) U.S. Cl. ................ 219/50; 219/121.36; 219/121.39; 219/121.4
(58) Field of Search ............... 285/328; 220/315; 219/521, 405, 411, 390

(56) References Cited

U.S. PATENT DOCUMENTS

| 4,988,130 | * | 1/1991 | Obara et al. | .......................... 285/328 |
| 5,228,587 | * | 7/1993 | Worthington | .......................... 220/315 |

FOREIGN PATENT DOCUMENTS

| 01298148 | * | 5/1988 | (JP) | ................................ C23C/14/22 |
| 10-247631 | * | 5/1988 | (JP) | ................................ H01L/21/304 |
| 05174602 | * | 7/1993 | (JP) | ................................ C23C/14/34 |
| 6-89689 | * | 3/1994 | (JP) | ................................ H01J/37/248 |
| 9-259780 | * | 10/1997 | (JP) | ................................ H01J/27/16 |

* cited by examiner

Primary Examiner—Gregory Mills
Assistant Examiner—Rudy Zervigon
(74) Attorney, Agent, or Firm—Thomas T. Moga, Esq.; Powell, Goldstein, Frazer & Murphy LLP

(57) ABSTRACT

A sleeve means is described. The sleeve means comprises a round plane and ring-shaped side adjacent to the round plane. The round plane has a central hole and six periphery holes thereon. The central hole and six peripheral holes respectively correspond to a central opening and six screw holes of a heater adapter flange used in Gasonics L3510 (trademark) etcher. The sleeve means could be jacketed onto the heater adapter flange for dispersing the stress on and reducing deformation of the heater adapter flange when the heater adapter flange is mounted on the chamber of the etcher.

3 Claims, 2 Drawing Sheets

SLEEVE FOR AN ADAPTER FLANGE OF THE GASONICS L3510 ETCHER

FIELD OF THE INVENTION

The present invention relates to a sleeve, and more specifically, to a sleeve jacketing onto an adapter flange.

BACKGROUND OF THE INVENTION

With the continuous development and progress of semiconductor techniques, the integration of ICs is increasing and the sizes of various devices are shrinking for the applications of Ultra Large Scale Integrated (ULSI) circuits. The distances among the devices have become smaller and smaller so that a chip could accommodate more devices to be formed thereon. In device integration of semiconductor manufacture, the key point of is the capability of lithography. In general, the lithography technique is used to transfer the desired patterns from the reticles or masks to the substrate for defining the determined circuits.

Typically, the photo-sensitive material, such as photoresist, is first deposited on the semiconductor substrate in the procedure of transfering patterns onto substrate. Then an illumination is performed to irradiate the photo-sensitive material through the reticles or masks and to expose the photo-sensitive material with the patterns thereof. Therefore, the patterns of the reticles or masks can be transferred and defined onto the photoresist. After performing the development process, the patterns formed on the photoresist are the same as that of the reticles or masks. Thereafter, the photoresist serving as a mask is used to perform the required etching step, doping procedure, etc. The residual photoresist is removed after performing the required procedures.

Referring to FIG. 1, a side elevation view is used to illustrate the chamber 10 of a Gasonics L3510 (trademark) etcher. An input tube 15 is connected to the chamber 10 for inputting the reactive gases, such as $O_2$ and $N_2$, into the chamber 10. An electrode plate 20 is mounted on the bottom of the chamber 10 to load a wafer 25. The load is for performing an ion bombardment process removing photoresist formed on the wafer. A microwave is used to activate the reactive gases to form the oxygen plasma particles comprising of $O^+$, $O_2^+$, $O_2$, $O_2^-$, and O during the removing procedure. The above plasma particles are used to remove the photoresist by colliding with photoresist on the wafer 25.

It is noted that the operation temperature for performing the etching step by using the Gasonics L3510 (trademark) etcher is about more than 200 degrees centigrade. For adjusting the operating temperature to be the required value, a heater 30 is connected to the bottom of the electrode plate 20 to heat up the wafer 25 through the electrode plate 20. The heater 30 is electrically connected to the power supply (not shown in FIG. 1) outside of the chamber 10 through the electric wire 40. However, because the chamber 10 must be maintain under a vacuum condition for removing the photoresist with a dry etching step, all channels connected into the chamber 10 must be covered with sealing means for preventing leakage. Therefore, the heater 30 and the electric wire 40 thereof are bundled with a heater adapter flange 50 in order to maintain the vacuum condition of the chamber 10.

Referring to FIG. 2, the heater adapter flange 50 described above is shown. In general, the material of the heater adapter flange 50, such as Teflon (trademark; butafluoroethylene polymer), is refractory and with lower hardness for effectively sealing the heater 30 and the electric wire 40. The heater adapter flange 50 comprises a duct portion 70 and a cylinder portion 75 connected to the end of the duct portion 70. A central opening 120 is formed on the top surface of the cylinder portion 75 and penetrates through the cylinder portion 75 and the duct portion 70. Additionally, six screw holes 110 are formed on the top surface of the cylinder portion 75 around the central opening 120 and penetrate through the cylinder portion 75. When the heater adapter flange 50 is used to seal the heater and the electric wire, a small O-ring 80 and a big O-ring 90 are used to enhance the sealing efficiency between the heater and the heater adapter flange 50 and between the heater adapter flange 50 and the chamber, respectively. Then, to fix and mount the heater adapter flange 50 onto the chamber 10 for sealing, six screws are turned into the six screw holes 110.

It is noted that the top surface 100 of the cylinder portion 75 is usually distorted out of shape after being fastened with the six screws to fix and mount the heater adapter flange. This distortion occurrs because the heater adapter flange has a hardness lower than that of the metal screws. Moreover, in the central opening 120, the distorted cylinder portion 75 is also the reason why the small O-ring 80 cannot effectively seal the chamber. On the other hand, the unequal screwing degrees for the six screws is also a reason why the big O-ring 90 cannot effectively seal the chamber 10.

SUMMARY OF THE INVENTION

The prime objective of the present invention is to provide a sleeve for jacketing onto the heater adapter flange of the Gasonics L3510 etcher, wherein the heater adapter flange is mounted onto the chamber of the etcher by six screws. Thus, the deformation of the heater adapter flange can be reduced effectively, and the stress in the heater adapter flange caused by the six screws can be uniformly dispersed.

A sleeve means, described hereinafter, comprises a round plane and ring-shaped side adjacent to the round plane. The round plane has a central hole and six periphery holes thereon. The central hole and six periphery holes respectively correspond to a central opening and six screw holes of a heater adapter flange used in Gasonics L3510 (trademark) etcher. The sleeve means could be jacketed onto the heater adapter flange for dispersing the stress on and reducing deformation of the heater adapter flange when the heater adapter flange is mounted on the chamber of the etcher.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
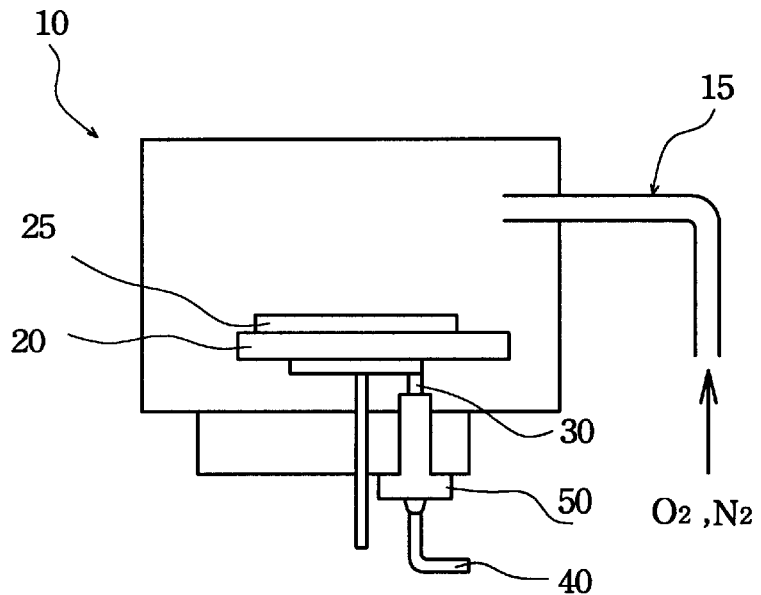
FIG. 1 is a side elevation view of the chamber and the heater adapter flange of Gasonics L3510 (trademark) etcher used for removing the photoresist on a wafer.

As described above, in a step of removing photoresist on a wafer in a chamber of Gasonics L3510 (trademark), an operation temperature in the chamber is required to be higher than 200 degrees centigrade. Also in this step, the chamber is maintained under a vacuum condition. Therefore, the heater adapter flange 50, as shown in FIG. 1, is used to seal the chamber 10 in order to prevent leakage. In general, a refractory material, such as Teflon (trademark; butafluoroethylene polymer), is used to make the heater adapter flange 50 for sealing the heater 30 and the wires 40. However, the six screws used to fix the heater adapter flange are harder than the heater adapter flange, thereby causing a non-uniform stress when the six screws are screwed into the heater adapter flange. The non-uniform stress usually reduce the sealing efficiency of the big O-ring 90 and the small O-ring 80. For solving these problems, a sleeve is proposed in the present invention for jacketing onto the heater adapter flange of the Gasonics L3510 (trademark) etcher. The sleeve, made of metal material, has a higher hardness than Teflon (trademark; butafluorethylene polymer). Therefore, the stress caused by six screws can be effectively dispersed. The detailed description is as follows.

Figure 2:
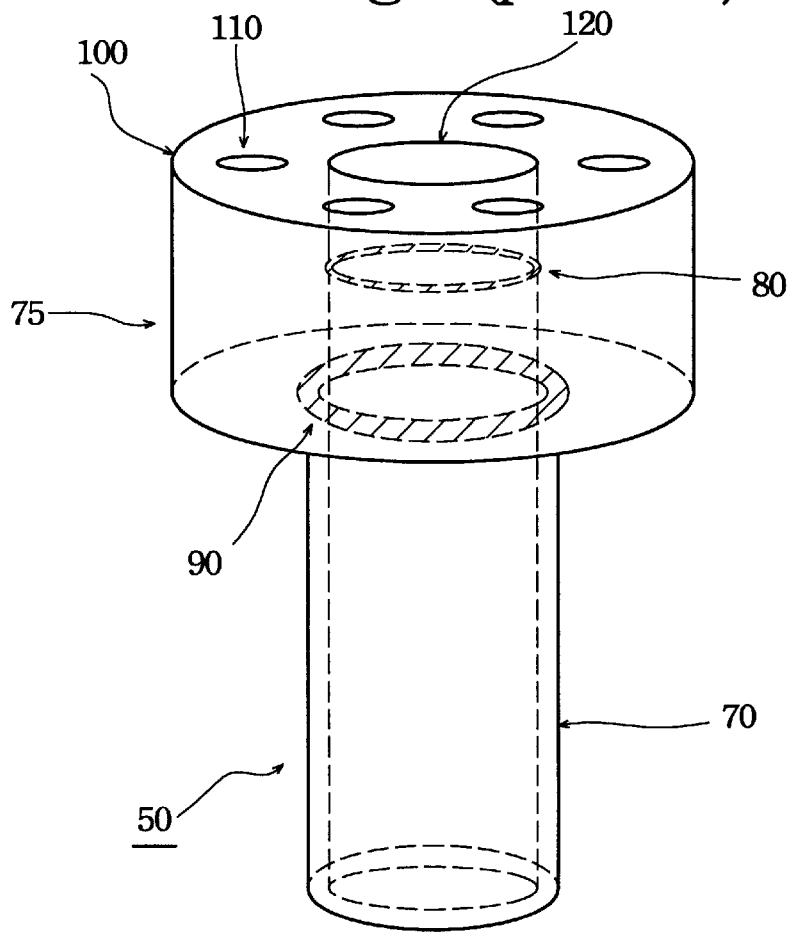
FIG. 2 is a side elevation view of the heater adapter flange for sealing the chamber and the heater.
Figure 3:
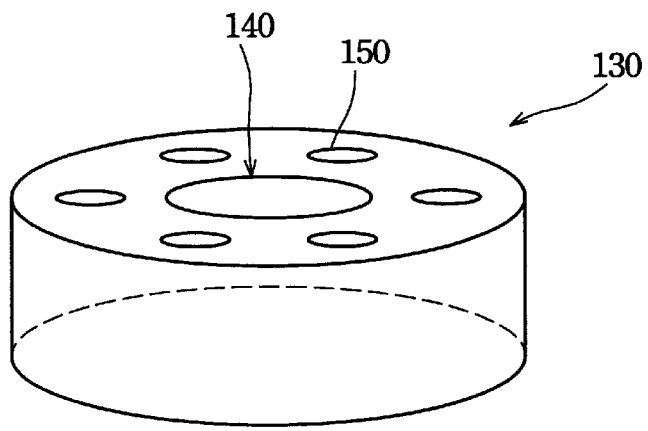
FIG. 3 is a side elevation view of the sleeve using for being jacketed onto the heater adapter flange in accordance with the present invention.

Referring to FIG. 3, the sleeve 130 proposed by the present invention is illustrated. The sleeve 130 is used to jacket onto the heater adapter flange 50 (as shown in FIG. 2) of the Gasonics L3510 (trademark) etcher. The sleeve 130 has a cylinder cap structure, and comprises a round plane and ring-shaped side adjacent to the round plane. The round plane has a central hole 140 and six periphery holes 150 around the central hole 140 thereon. The central hole 140 and the six peripheral holes 150 respectively correspond to the central opening 120 and the six screw holes 110 of the heater adapter flange 50 illustrated in FIG. 2. Accordingly, through the corresponding central hole 140 and the six peripheral holes 150, the central opening 120 and the six screw holes 110 of the heater adapter flange 50 are exposed by the sleeve 130, when the sleeve 130 is jacketed onto the cylinder portion 75 of the heater adapter flange 50.

Figure 4:
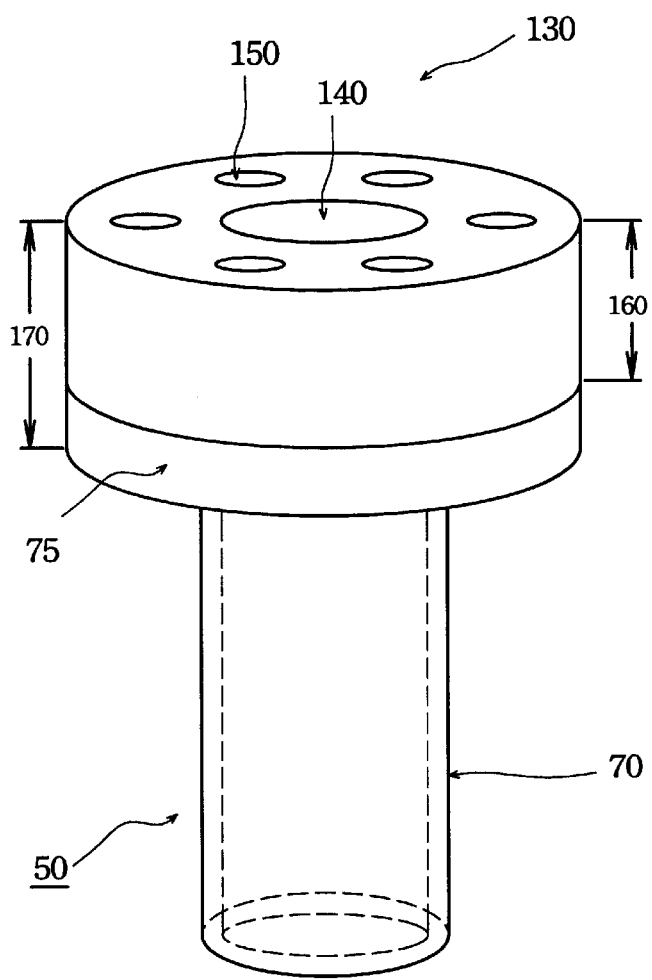
FIG. 4 is a side elevation view illustrating the heater adapter flange with the sleeve jacketed thereon in accordance with the present invention.

Referring to FIG. 4, the heater adapter flange 50 with the sleeve 130 jacketed thereon is illustrated. As described above, the central hole 140 and the six peripheral holes 150 respectively correspond to the central opening 120 and the six screw holes 110 of the heater adapter flange 50. Thus, the heater 30 and the wires 40 thereof as shown in FIG. 1 can penetrate through the central hole 140 of the sleeve 130 and the central opening 120 of the heater adapter flange 50 into the duct portion 70. The sleeve 130 is jacketed onto the cylinder portion 75 of the heater adapter flange 50. The heater adapter flange 50 can be mounted onto the chamber 10 by screwing six screws through the sleeve 130 and the heater adapter flange 50.

It is noted that the selected material of the sleeve 130 is a material such as metal. Metal has a higher hardness than that of Teflon (trademark; butafluorethylene polymer). Thus, when the sleeve 130 is jacketed onto the cylinder portion 75 of the heater adapter flange 50 and then the six screws are screwed thereon for mounting and fixing the heater adapter flange onto the chamber of the Gasonics L3510 (trademark) etcher, the stress occurring on the heater adapter flange 50 can be effectively dispersed and the deformation of the heater adapter flange 50 can also be prevented. Specifically, there is no distortion occurring on the round plane of the cylinder portion 75 after screwing six screws into the heater adapter flange 130 through the sleeve 130 because the sleeve 130 is harder than the heater adapter flange 50. Further, even when the six screws are turned into the heater adapter flange with different depths and the different depths therefore cause non-uniform stress, the heater adapter flange 50 is still resists deformation and distortion because the sleeve 130 is harder than the heater adapter flange 50 made of Teflon (trademark; butafluoroethylene polymer).

Therefore, by using the sleeve 130 proposed in the present invention to jacketing onto the heater adapter flange 50, the sealing efficiency between the heater adapter flange 50 and the chamber 10 can be promoted mainly. Also by the proposed sleeve 130, the sealing efficiency between the heater adapter flange 50 and the heater 30 is promoted. The deformation of the heater adapter flange 50 will not occur, and the small O-ring 80 in the central opening 120 seals the heater 30 effectively. On the other hand, the stress of the heater adapter flange 50 due to the six screws is dispersed, and the big O-ring 90 on the outer surface of the cylinder portion 75 adjacent to the duct portion 70 seals the chamber 10 effectively.

Still referring to FIG. 4, it is noted that the width 160 of the ring-shaped side of the sleeve 130 is smaller than the total width 170 of the sidewall of the cylinder portion 75. Thus, even when the cylinder portion 75 is compressed down due to the turning the six screws when the heater adapter flange 50 with the sleeve 130 thereon is mounted onto the chamber 10 by using the six screws, the ring-shaped side of the harder sleeve 130 does not collide with the chamber heater adapter flange 50.

The sleeve provided in the present invention has many advantages. First, the sleeve is jacketed onto the heater adapter flange closely, so that the deformation of the heater adapter flange can be reduced and the stress thereof can be dispersed effectively, thereby prolonging the lifetime of the heater adapter flange. Moreover, because the problems discussed, the stress and the deformation issues, are effectively solved by jacketing the sleeve onto the heater adapter flange, the elasticity of the big and small O-rings can be maintained for a longer period, and the life time thereof can be prolonged too. Furthermore, the O-rings would not easily fall off and would not become deformed.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A heating assembly connected to an etching chamber, the heating means comprising:
   a heater, for providing a thermal energy in the etching chamber;
   a heater adapter flange, formed of a first material, for bundling the heater and sealing the etching chamber, the heater adapter flange comprising a duct portion and a cylinder portion connected to the duct portion, wherein a top surface of the cylinder portion has a central opening and six screw holes thereon, the central opening penetrating through the cylinder portion and the duct portion, and the six screw holes around the central opening penetrating through the cylinder portion;
   a wire, connected between the heater and a power supply through the duct portion;

a first O-ring, mounted on a sidewall of the central opening of the cylinder portion, for sealing the heater and the heater adapter flange;

a second O-ring, mounted on a surface of the cylinder portion adjacent to the duct portion, for sealing the heater and the chamber; and a sleeve, made of a second material, having a higher hardness than the first material, for jacketing onto the cylinder portion, wherein the sleeve comprises a round plane and ring-shaped side adjacent to the round plane, and the round plane having a central hole and six periphery holes thereon, wherein the central hole and the six periphery holes are respectively corresponded to the central opening and the six screw holes of the heater adapter flange.

2. The heating assembly of claim 1, wherein the sleeve is made of metal material for dispersing a stress on the heater adapter flange after the heater adapter flange is screwed with six screws through the six periphery holes of the sleeve into the six screw holes.

3. The heating assembly of claim 1, wherein the ring-shaped side of the sleeve having a width greater than that of the cylinder portion of the heater adapter flange.

* * * * *